US010979032B1

(12) United States Patent
Leong et al.

(10) Patent No.: US 10,979,032 B1
(45) Date of Patent: Apr. 13, 2021

(54) TIME-PROGRAMMABLE FAILSAFE PULLDOWN CIRCUIT FOR GAN SWITCH

(71) Applicant: Infineon Technologies Austria AG, Villach (AT)

(72) Inventors: Kenneth Kin Leong, Villach (AT); Petio Natzkin, Unterschleissheim (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/736,896

(22) Filed: Jan. 8, 2020

(51) Int. Cl.
*H03K 3/012* (2006.01)
*H03K 17/56* (2006.01)

(52) U.S. Cl.
CPC ............. *H03K 3/012* (2013.01); *H03K 17/56* (2013.01)

(58) Field of Classification Search
CPC ...... H03K 3/012; H03K 17/56; H03K 17/567; H03K 17/58; H03K 17/60; H03K 17/602
USPC .................................................. 327/108–112
See application file for complete search history.

(56) References Cited

U.S. PATENT DOCUMENTS

| | | | |
|---|---|---|---|
| 4,801,822 A | 1/1989 | Idaka et al. | |
| 5,514,996 A | 5/1996 | Aizawa | |
| 6,316,956 B1 | 11/2001 | Oglesbee | |
| 7,952,418 B2 | 5/2011 | McDonald et al. | |
| 8,760,219 B2 | 6/2014 | Chao | |
| 9,209,787 B2 | 12/2015 | Shelton et al. | |
| 9,305,917 B1 | 4/2016 | Curatola et al. | |
| 9,595,950 B1 * | 3/2017 | Seok ................... H03K 17/102 |
| 9,853,637 B1 | 12/2017 | Meiser et al. | |
| 9,865,729 B1 | 1/2018 | Pendharkar et al. | |
| 10,483,352 B1 | 11/2019 | Mokhti et al. | |
| 10,720,913 B1 | 7/2020 | Leong et al. | |
| 2006/0238927 A1 | 10/2006 | Morbe et al. | |
| 2007/0081280 A1 | 4/2007 | Strzalkowski et al. | |
| 2009/0072269 A1 | 3/2009 | Suh et al. | |
| 2010/0060326 A1 | 3/2010 | Palmer et al. | |

(Continued)

OTHER PUBLICATIONS

Coccia, A., et al., "Wide input Voltage range Compensation in DC/DC Resonant Architectures for On-Board Traction Power Supplies", IEEE 2007 European Conference on Power Electronics and Applications, Sep. 2-5, 2007, 1-10.

(Continued)

*Primary Examiner* — Diana J. Cheng
(74) *Attorney, Agent, or Firm* — Murphy, Bilak & Homiller, PLLC

(57) ABSTRACT

Circuits and devices are provided for reliably maintaining a normally-off Gate Injection Transistor (GIT), or similar, in a non-conducting state when a gate of the GIT is not driven with a turn-on control signal. This is accomplished using a failsafe pulldown coupled to the GIT's gate. The failsafe pulldown includes a resistance modulation circuit, which varies the effective gate resistance of the GIT, such that a low resistance is provided for an interval immediately after a turn-on transition of the GIT, thereby facilitating a high-current pulse for charging the GIT's gate. Subsequently, a high resistance is provided, such that a much lower current is driven to maintain the GIT in its on state. The failsafe pulldown enables a GIT, or similar, to be driven with a relatively simple driver, which may be provided external to the power switch device or integrated in the same die as the power switch.

23 Claims, 10 Drawing Sheets

(56) References Cited

U.S. PATENT DOCUMENTS

| | | |
|---|---|---|
| 2010/0118458 A1 | 5/2010 | Coffey |
| 2010/0205614 A1 | 8/2010 | Harrington |
| 2011/0273258 A1 | 11/2011 | Duplessis et al. |
| 2012/0158188 A1 | 6/2012 | Madala |
| 2014/0049297 A1 | 2/2014 | Nagai et al. |
| 2014/0091311 A1 | 4/2014 | Jeon et al. |
| 2014/0167724 A1* | 6/2014 | Deng .................. H02M 3/158 323/311 |
| 2015/0171852 A1 | 6/2015 | Pang |
| 2015/0228353 A1* | 8/2015 | Qing .................... G11C 19/28 377/75 |
| 2015/0255547 A1 | 9/2015 | Yuan et al. |
| 2015/0295574 A1 | 10/2015 | Nagai |
| 2015/0318851 A1 | 11/2015 | Roberts et al. |
| 2015/0344335 A1 | 12/2015 | Hughes et al. |
| 2015/0381148 A1 | 12/2015 | Zeng |
| 2016/0072376 A1 | 3/2016 | Ahlers et al. |
| 2016/0087622 A1 | 3/2016 | Kaeriyama |
| 2016/0142048 A1 | 5/2016 | Zoels et al. |
| 2017/0040312 A1 | 2/2017 | Curatola et al. |
| 2017/0271497 A1 | 9/2017 | Fayed et al. |
| 2017/0331471 A1 | 11/2017 | Yuzurihara et al. |
| 2019/0123215 A1 | 4/2019 | Stark |
| 2019/0372567 A1 | 12/2019 | Yoshida et al. |
| 2020/0007091 A1 | 1/2020 | Li et al. |
| 2020/0007119 A1 | 1/2020 | Li et al. |
| 2020/0020779 A1 | 1/2020 | Trang et al. |
| 2020/0343352 A1 | 10/2020 | Trang et al. |

OTHER PUBLICATIONS

Leong, Kennith Kin, et al., "Integrated Failsafe Pulldown Circuit for GaN Switch", U.S. Appl. No. 16/423,314, filed May 28, 2019.

Leong, Kennith Kin, et al., "Transformer-Based Driver for Power Switches", U.S. Appl. No. 16/560,145, filed Sep. 4, 2019.

* cited by examiner

TIME-PROGRAMMABLE FAILSAFE PULLDOWN CIRCUIT FOR GAN SWITCH

TECHNICAL FIELD

The present application relates to a circuit topology and a power switch device, each of which includes a time-programmable failsafe pulldown that provides a variable effective gate resistance for a Gallium Nitride (GaN) or similar transistor.

BACKGROUND

Gallium Nitride (GaN) based switches, and other similar High Electron Mobility Transistors (HEMTs) based on heterojunctions, provide high voltage support, low drain-to-source on resistance, low gate-drive charge requirements, and fast switching. As a result of these characteristics, GaN-based switches are increasingly being used in applications that require high efficiency and high-frequency support including, notably, switching power converters. However, GaN-based switches often have unique gate-drive requirements, as compared with conventional metal-oxide semiconductor field-effect transistors (MOSFETs) and bipolar junction transistors (BJTs), and typically require complex gate-drive circuitry.

A GaN-based switch in its native state is a normally-on (depletion-mode) device. Such a device conducts current from its drain to its source when no voltage is applied to its gate, relative to its source, and requires application of a negative voltage to its gate to force the device into a non-conducting (blocking) state. Such normally-on behavior is unsuitable for most applications. Hence, modifications to GaN-based switches have been developed so as to convert them into normally-off (enhancement-mode) devices. For example, a p-doped GaN layer introduced between the gate metal and the heterostructure of a GaN-based switch has the effect of raising the switch's turn-on/off voltage threshold to a positive value, thereby providing a normally-off device. Enhancement-mode switches based on such a gate structure are known as Gate Injection Transistors (GITs).

GaN-based GITs have a relatively low threshold voltage for switching between their conducting (on) and blocking (off) states. This threshold voltage is typically in the range of 1.2 to 3.5V, which is significantly lower than corresponding thresholds, e.g., 5V, for other power transistors such as power MOSFETs. Additionally, HEMTs, including GaN-based GITs, have low gate-to-source capacitances, which are notably smaller than corresponding capacitances in power MOSFETs. While the low threshold voltage and low gate capacitance of a GaN-based GIT advantageously provide fast switching speeds and low gate charge requirements, these characteristics also make a GaN-based GIT susceptible to being undesirably turned on due to voltage perturbations at the gate of the GIT during intervals when the GIT is intended to be held in its non-conducting (blocking) state. For example, noise at the gate could cause its voltage to rise above the GIT's threshold voltage, though the gate is intended to be held at a low voltage. Such noise may occur during operational intervals when the GIT is intended to be held in its non-conducting state, and during start-up intervals during which the gate may not yet be provided with a driven control signal. Additionally, the gate voltage may be susceptible to ringing after the control voltage is transitioned from a high (turn-on) voltage level to a low (turn-off) voltage level. The voltage level of the ringing can exceed the GIT's threshold voltage, thereby unintentionally turning on the GIT.

Another complication when driving a GIT is that a driving current is required to maintain the GIT in its conducting state after a turn-on transition. To quickly switch a GIT to its on state and maintain the on state without excessive driver power consumption, a GIT gate is preferably provided a high-current pulse at the transition from an off to an on state, and a subsequent steady-state current that has a lower level than the high-current pulse.

The above problems are conventionally addressed using complex circuitry customized for driving GaN-based GITs or similar enhancement-mode HEMTs. Such circuitry typically drives a negative voltage onto the gate to turn off the GIT, thereby providing significant margin between the driven gate voltage and the turn-on threshold voltage of the GIT. This margin allows the GaN-based GIT to be reliably held in its non-conducting (blocking) state. A resistor-capacitor (RC) circuit is often included in the driving circuitry, so as to provide high current when the GaN-based GIT is initially transitioned to a conducting state. Lower current is provided subsequently to maintain the conducting state of the GIT. The RC circuit additionally has the effect of applying a relatively high magnitude of the negative voltage when the GaN-based GIT is transitioned off, and this negative voltage dissipates towards zero as the off interval proceeds.

The typical GIT driver circuitry described above has many problems. First, the negative voltage provided at the gate during the turn-off interval leads to a large required voltage swing when the GIT is transitioned to its conducting state, thereby slowing the transition and the potential switching speed of the GIT. Second, the RC-based time-varying voltage decay means that the level of the negative voltage will vary according to the switching duty cycle, thereby leading to transition times that are inconsistent, which complicates the use and control of the GIT. Third, while the negative voltage described above reliably holds the GIT off during steady-state operation, spurious non-zero voltage during an initial start-up interval, before the negative voltage is driven to the gate, may undesirably turn on the GIT. Fourth, the negative voltage adds an offset to the effective reverse body diode voltage, thereby increasing the threshold voltage of the effective reverse body diode and increasing associated losses. Lastly, the driver circuitry is quite complex, and requires fairly complex control of switches within the driver circuit itself.

SUMMARY

Circuits and power switch devices that incorporate GaN-based GITs, or similar, are provided. These circuits and devices modulate the effective gate resistance of the GIT, such that a high current level is provided to the GIT gate at a turn-on transition, whereas a low (maintenance) current level is provided during a subsequent steady-state conducting interval of the GIT. This variation in current level is autonomously provided by resistance modulation circuitry even when the GIT gate is driven using a gate driver that only outputs two voltages. In some embodiments, these circuits and devices are configured such that they may be driven by conventional single-channel (two-level) drivers, which are simpler than existing drivers for GaN-based GITs, and which do not require use of a negative gate voltage to safely hold a GIT in its non-conducting state. In other embodiments, devices incorporate driver functionality within the same device as a GIT and the resistance modulation circuitry.

According to an embodiment of a power switch device, the power switch device includes a normally-off power transistor, a control terminal, a control reference terminal, a normally-on pulldown transistor and a resistance modulation circuit. The normally-off power transistor has a gate, a source and a drain, and the control terminal is connected to the gate. The pulldown transistor is configured to short the gate to the source unless a voltage higher than a turn-on threshold applied across the control terminal and the control reference terminal, and has a pulldown gate, a pulldown source, and a pulldown drain. The resistance-modulation circuit is coupled between the source and the control reference terminal, and includes a modulation transistor. This circuit is configured to modulate a resistance between the control terminal and the control reference terminal, such that a charging current is provided to the gate, for a predetermined charging interval, responsive to application of a device turn-on voltage between the control terminal and the control reference terminal, and a maintenance current is provided to the gate after the predetermined charging interval. The maintenance current has a level that is lower than a level of the charging current.

According to an embodiment of a power switch device with an integrated driver, the device and driver include a normally-off power transistor, first and second load terminals, supply and supply reference terminals, a control terminal, a normally-on pulldown transistor, an integrated driver, and a resistance-modulation circuit. The normally-off power transistor includes a drain, which is connected to the first load terminal, a source, which is connected to the second load terminal, and a gate. The supply and supply reference terminals are configured for connection to an external power supply. The control terminal is configured to input a digital control signal that controls conduction between the first and second load terminals. The normally-on pulldown transistor has a pulldown gate, a pulldown source, and a pulldown drain, and is configured to short the gate and source of the power transistor when the digital control signal does not command conduction of the power switch device. The integrated driver circuit is configured to source current to and/or sink current from the pulldown gate, based upon the digital control signal. The resistance-modulation circuit is coupled between the source and the supply reference terminal, and includes a modulation transistor. This circuit is configured to modulate a resistance between the supply terminal and the supply reference terminal, such that a charging current is provided to the gate, for a predetermined charging interval, responsive to the digital control signal transitioning to command conduction, and a maintenance current is provided to the gate after the predetermined charging interval. The maintenance current has a level that is lower than a level of the charging current.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

Figure 1:
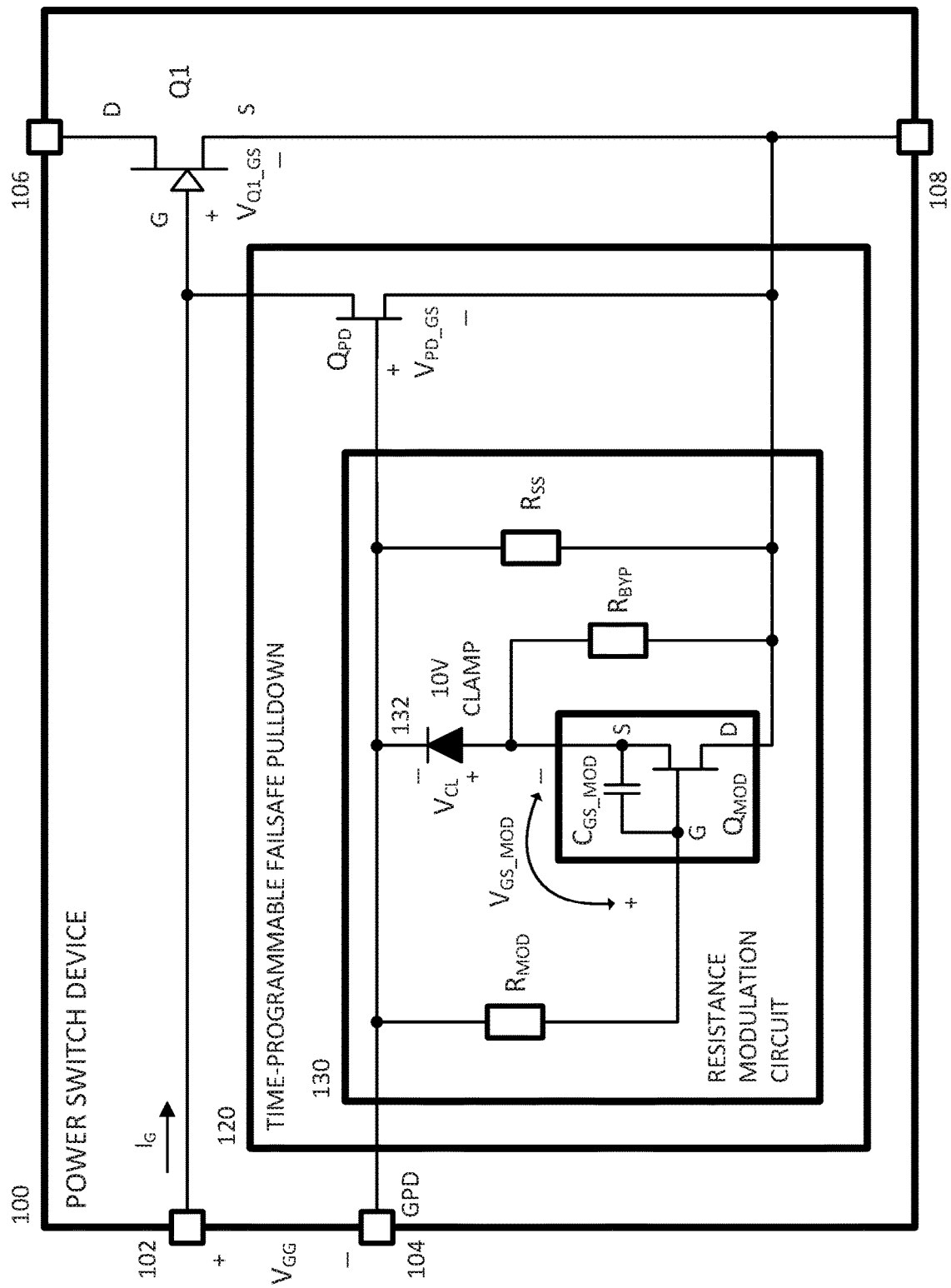
FIG. 1 illustrates a schematic diagram of a power switch device including a failsafe pulldown circuit that incorporates circuitry for modulating an effective gate resistance.

The embodiments described herein provide circuits and power switch devices that include a time-programmable failsafe pulldown for the gate of a power switch. While the described examples use a Gallium Nitride (GaN) based Gate Injection Transistor (GIT) as the power switch, the techniques and circuits may be advantageously used with other transistor or semiconductor types including, notably, other enhancement-mode High Electron Mobility Transistors (HEMTs) characterized in having low turn on/off threshold voltages and low gate capacitances. The failsafe pulldown prevents the power switch from being unintentionally turned on due to spurious noise or ringing, and does not require use of a negative voltage at the gate of the power switch. Many of the problems and complications associated with applying a negative voltage to the power switch gate are, thus, avoided.

The failsafe pulldown of the following examples modulates an effective gate resistance of a power switch device, wherein the modulation is time programmable. The gate (control terminal) of a GIT, or similar, power switch is preferably driven using a high-current pulse to quickly transition the GIT from its off to its on state, and using a low current to maintain the on state until the GIT is to be turned off. This can be accomplished by using a two-channel driver and/or other external components, including current-limiting resistors between the two-channel driver and the GIT gate, in conjunction with a non-time-programmable failsafe pulldown. The time-programmable failsafe pulldown circuitry described herein does not require such a two-channel driver, and does not require a series resistor that limits the current level of the high-current pulse.

The time-programmable failsafe pulldown circuitry modulates a resistance of the gate path loop of a power switch device. The resultant gate path loop has a low resistance at a turn-on transition of the GIT, so as to provide the desired high-current turn-on transition pulse. The resistance of the gate path loop is subsequently increased, after the GIT is transitioned on, so as to provide the desired low current level that maintains the on state of the GIT. Resistors determine (program) the time duration of the high-current pulse and the resistance level of the gate path loop during the maintenance interval. These resistors may be monolithically integrated within a power switch device, e.g., in the same GaN die as the power switch and a failsafe pulldown switch, so as to minimize size and cost. Alternatively, these resistors may be provided external to a GaN die, so as to provide programming flexibility. Regardless of the level of integration, the time-programmable failsafe pulldown enables the use of a relatively simple single-channel driver, e.g., as used with conventional power MOSFETs, while meeting the unique requirements for reliably holding a GIT in its off state, and providing a high-current turn-on pulse and a low maintenance current to the GIT control terminal.

The embodiments are described primarily in the context of a power switch device in which a failsafe pulldown circuit and a power switch (e.g., a GIT) are integrated in the same GaN semiconductor die. The die could similarly be comprised of some other group III/V semiconductor or a silicon-based semiconductor. The described integration of the failsafe pulldown circuit and the power switch presents significant advantages in reliably maintaining a desired turn-off (non-conducting) state of the power switch. In particular, such integration minimizes parasitic inductances between the gate of the power switch and the failsafe pulldown circuit, thereby constraining voltage ringing that potentially occurs when the control voltage driven to the gate transitions between high and low voltage levels. The reduced ringing effectively clamps the power switch's gate-to-source voltage close to zero during turn-off intervals, which prevents unintended turning on of the power switch. Integration of the failsafe pulldown circuit in close proximity to the power switch also reduces interconnect paths (e.g., traces, terminals), thereby minimizing the potential for noise to couple onto the gate. This also prevents unintentional turning on of the power switch, particularly when no drive signal is applied to the gate as occurs during start-up intervals.

While the embodiments are described primarily in the context of an integrated power switch device including both a failsafe pulldown circuit and a power switch, the failsafe pulldown circuit and the power switch may be provided on separate dies, i.e., may not be monolithically integrated. Such a solution provides improvement over prior circuitry for controlling a GIT, but may not achieve the significant advantage of reduced noise (improved reliability) that is provided by an integrated power device.

The failsafe pulldown circuit and the power switch may be provided on separate dies that are integrated within the same package, i.e., within a system-in-package or multi-chip module. Such a system-in-package achieves reduced parasitics and improved reliability as compared with a solution spread across separate packages, but may not achieve the same level of performance as a solution wherein the failsafe pulldown circuit and the power switch are integrated in the same die.

The power switch device may be controlled by a single-channel driver that is considerably simpler than prior drivers used for controlling GITs, and that notably avoids complex switching sequences (state machines) within the driver as well as circuitry for generating a negative voltage. The time-programmable failsafe pulldown circuit operates autonomously and requires no separate control. Embodiments of power switch devices are described in which an external single-channel driver may be used for driving the power switch devices. Further embodiments are described in which the driver functionality is integrated within the same GaN die as the GIT and the failsafe pulldown circuit. The embodiments exhibit the common feature that a time-programmable failsafe pulldown circuit provides a step change in the effective resistance of the gate path loop of a power switch.

Power Switch Device with Resistance Modulation Circuit

FIG. 1 illustrates an embodiment of a power switch device 100 according to the invention. The power switch device 100 includes a power switch Q1, a first load terminal 106, a second load terminal 108, a control terminal 102, a control reference terminal 104, and a time-programmable failsafe pulldown circuit 120. The illustrated power switch Q1 is a GaN-based GIT, which is a type of enhancement-mode HEMT. The power switch Q1 has a drain (D), which is connected to the first load terminal 106, a source (S), which is connected to the second load terminal 108, and a gate (G), which is connected to the control terminal 102. The control reference terminal 104 is connected, via the time-programmable failsafe pulldown circuit 120, to the source of the power switch Q1, and provides a reference connection (labelled GPD) for an external driver circuit that drives the gate of the power switch Q1. (Such an external driver circuit is not shown in FIG. 1, but is shown, e.g., in FIG. 6.) The illustrated power switch device 100 has only four terminals.

The power switch Q1 is a normally-off device, but has a relatively low threshold voltage for turning on or off, e.g., in the range of 1.2 to 3.5V for a GaN-based GIT. This, in addition to the low gate capacitance of the power switch Q1, makes it susceptible to unintentional transitions to a conducting state. The time-programmable failsafe pulldown circuit 120 prevents such unintentional transitions, and does so autonomously, i.e., no separate external signals are required to control the time-programmable failsafe pulldown circuit 120. In particular, the time-programmable failsafe pulldown circuit 120 shorts the gate of the power switch Q1 to the source of the power switch Q1, such that there is no positive control voltage $V_{Q1\_GS}$ to turn on the power switch Q1, during periods when the voltage $V_{GG}$ provided across the control and control reference terminals 102, 104 is below a turn-on voltage for the power device 100, or when this voltage $V_{GG}$ is not driven, e.g., is floating.

Figure 2:
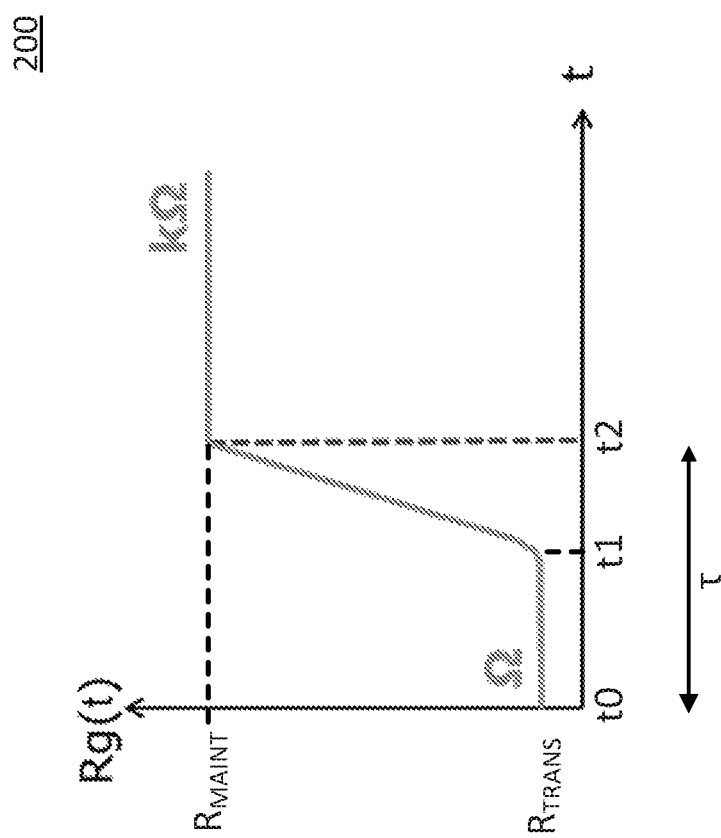
FIG. 2 illustrates a waveform of the effective gate resistance around a turn-on transition of a GaN-based switch.

FIG. 2 illustrates a waveform 200 for an idealized effective gate resistance Rg(t) of a power switch device, such as that illustrated in FIG. 1, as seen between a gate and a reference terminal, such as the control and control reference terminals 102, 104 of FIG. 1. Such resistance Rg(t) is illustrated at and after a turn-on transition of a power switch, such as the power switch Q1. The power switch is turned on at or prior to time t0, at which point the effective gate resistance Rg(t) is quite low, e.g., on the order of single-digit ohms or less. After the power switch transitions to its conducting state, the effective gate resistance Rg(t) is increased to a much higher value, e.g., on the order of single-digit KOhms or higher. As illustrated, the effective gate resistance Rg(t) changes from a turn-on transition resistance $R_{TRANS}$ to a maintenance level $R_{MAINT}$ between times t1 and t2. Such modulation of the effective gate resistance Rg(t) facilitates a high drive current to transition the power switch on before time t1, and a low drive current to maintain the on state of the power switch after time t2, even when only a single-channel, two-voltage-level driver is coupled to the power switch device. The resistance level $R_{MAINT}$ may be tuned to match a desired maintenance current level for a particular power switch, whereas the resistance level $R_{TRANS}$ may be determined by (relatively small) inherent resistances within the gate path loop, including a gate-to-source resistance of the power switch, a drain-to-source resistance of a modulation switch, and an effective diode resistance of a voltage clamp. As described in further detail below, the transition pulse duration τ and the maintenance resistance level $R_{MAINT}$ may be tuned (programmed) using resistors in the time-programmable failsafe pulldown circuit 120. Additional waveforms that illustrate the results of such a modulation of the effective gate resistance Rg(t) are provided in FIGS. 3 and 5, which are described further below.

The time-programmable failsafe pulldown circuit 120 includes a normally-on pulldown switch $Q_{PD}$ and a resistance modulation circuit 130. The normally-on pulldown switch $Q_{PD}$ is preferably fabricated in the same or a similar technology as the power switch Q1, and in the same die as the power switch Q1. For the illustrated example wherein the power switch Q1 is a GaN-based GIT (enhancement-mode HEMT), the pulldown switch $Q_{PD}$ is preferably a depletion-mode GaN-based HEMT, as illustrated. Such a pulldown switch $Q_{PD}$ is turned off (set to a blocking mode) when its gate-to-source voltage $V_{PD\_GS}$ is sufficiently negative, e.g., below a turn-off threshold voltage $V_{PD\_THR}$ that is typically in the range of −4V to −7V. Otherwise, including when zero pulldown gate-to-source voltage is applied and when no voltage is actively driven across the pulldown gate and pulldown source, the pulldown switch $Q_{PD}$ conducts. Locating the pulldown switch $Q_{PD}$ in the same die as the power switch Q1 and in close proximity to the gate and source of the power switch Q1 makes it extremely unlikely that the power switch Q1 will unintentionally transition to its on state.

The resistance modulation circuit 130 includes a voltage clamp 132, illustrated as a "10V clamp" diode, and a steady-state pulldown resistor $R_{SS}$, which combine to autonomously provide the desired control of the pulldown switch $Q_{PD}$. The voltage clamp 132 is configured to generate a pulldown gate-to-source voltage $V_{PD\_GS}$ that is below the negative threshold voltage $V_{PD\_THR}$ that is required to turn off the pulldown switch $Q_{PD}$, during intervals when the power switch Q1 is on (conducting). The voltage clamp 132 may be, or be modelled as, a diode having a threshold voltage. The magnitude of the forward threshold voltage for a typical diode is lower than the magnitude of the turn-off threshold voltage $V_{PD\_THR}$ of the pulldown switch $Q_{PD}$. While illustrated as a single diode, the voltage clamp 132 may actually include several individual diodes cascaded (stacked) in series, so as to achieve a clamping voltage $V_{CL}$ that is needed to turn-off the pulldown switch $Q_{PD}$, i.e., $V_{CL} > |V_{PD\_THR}|$.

In some embodiments, the voltage clamp 132 may include multiple gated or PN diodes built from GaN-based GITs. A gated-GIT diode may be constructed by coupling the gate and source of a GIT together, thereby forming a two-terminal device wherein the gate/source serves as an anode, the drain serves as a cathode, and the device typically has a threshold (knee) voltage of 0.9 to 1.5V. A GIT-based PN diode is constructed by coupling a GIT's drain and source together. The gate of the resultant two-terminal device serves as an anode, the drain/source serves as the cathode, and the device has a relatively stable threshold (knee) voltage of about 3.3V. For a pulldown threshold voltage $V_{PD\_THR}$ of −7V for the pulldown switch $Q_{PD}$, an appropriate voltage clamp having a threshold voltage of about 10V may be constructed by connecting three GIT-based PN diodes together, ten gated-GIT diodes together, or some other combination that results in a combined threshold voltage greater than about 10V. Use of GIT-based diodes has the advantage that the voltage clamp 132 may be fabricated in the same GaN die as the power switch Q1 and the pulldown switch $Q_{PD}$.

The pulldown resistor $R_{SS}$, also termed a steady-state resistor herein, ensures that the pulldown switch $Q_{PD}$ is turned back on under conditions of no power/signal. For example, if no voltage is being driven across the control and control reference terminals 102, 104, the pulldown resistor $R_{SS}$ provides a path for discharging the pulldown gate. This ensures that the pulldown gate and pulldown source are pulled to the same voltage, i.e., $V_{PD\_GS}=0$, thereby turning on the pulldown switch $Q_{PD}$, so as to short the power transistor gate (G) to the power transistor source (S). A representative resistance for $R_{SS}$ is 2 KΩ but, as explained below, this value may be tuned so as to set a desired maintenance current level. In a preferred embodiment in which the power and pulldown switches Q1, $Q_{PD}$ are integrated in the same semiconductor die, the pulldown resistor $R_{SS}$ may also be integrated in the same die. For the example of a GaN semiconductor die, the pulldown resistor $R_{SS}$ may be constructed using one or more two-dimensional electron gas (2DEG) regions of the GaN semiconductor die, each of which is substantially a GaN HEMT channel without a gate.

The resistance modulation circuit 130 also includes a modulation switch $Q_{MOD}$, which alters the resistance of a gate path loop of the power switch device 100 when the power switch Q1 is turned on. (Pulldown switch $Q_{PD}$ is turned off). This gate path loop is the current loop from the control terminal 102 to the control reference terminal 104, and includes, when the power switch Q1 is on, the gate of the power switch Q1, the source of the power switch Q1, and a path, through the failsafe pulldown 120, that returns to the control reference terminal 104. When the modulation switch $Q_{MOD}$ is turned on, a low-impedance path is formed through the modulation switch $Q_{MOD}$ and the voltage clamp 132, each of which provide negligible resistance. When the modulation switch $Q_{MOD}$ is turned off, the current is instead forced to flow through the resistors $R_{BYP}$, $R_{SS}$, which present a high-impedance path, at least as compared with the current path through modulation switch $Q_{MOD}$. The low-impedance path instantiated when the modulation switch $Q_{MOD}$ is turned on provides the high-current transition pulse described previously. The high-impedance path instantiated when the modulation switch $Q_{MOD}$ is turned off provides a low level of current for maintaining the on state of the power switch Q1.

The illustrated modulation switch $Q_{MOD}$ is a normally-on (depletion mode) HEMT, and is preferably integrated in the same GaN die as the power switch Q1. The modulation switch $Q_{MOD}$ has an associated gate-to-source capacitance $C_{GS\_MOD}$, which may not be a separate component but can be an intrinsic capacitance of the modulation switch $Q_{MOD}$. This capacitance $C_{GS\_MOD}$ is expressly shown in FIG. 1, as it affects the duration of the high-current pulse. A modulation resistor $R_{MOD}$ couples the control reference terminal 104 and the gate of the pulldown switch $Q_{PD}$ to the gate of the modulation switch $Q_{MOD}$, and the resistance of the modulation resistor $R_{MOD}$ is chosen to achieve a desired duration of the high-current pulse.

Figure 3:
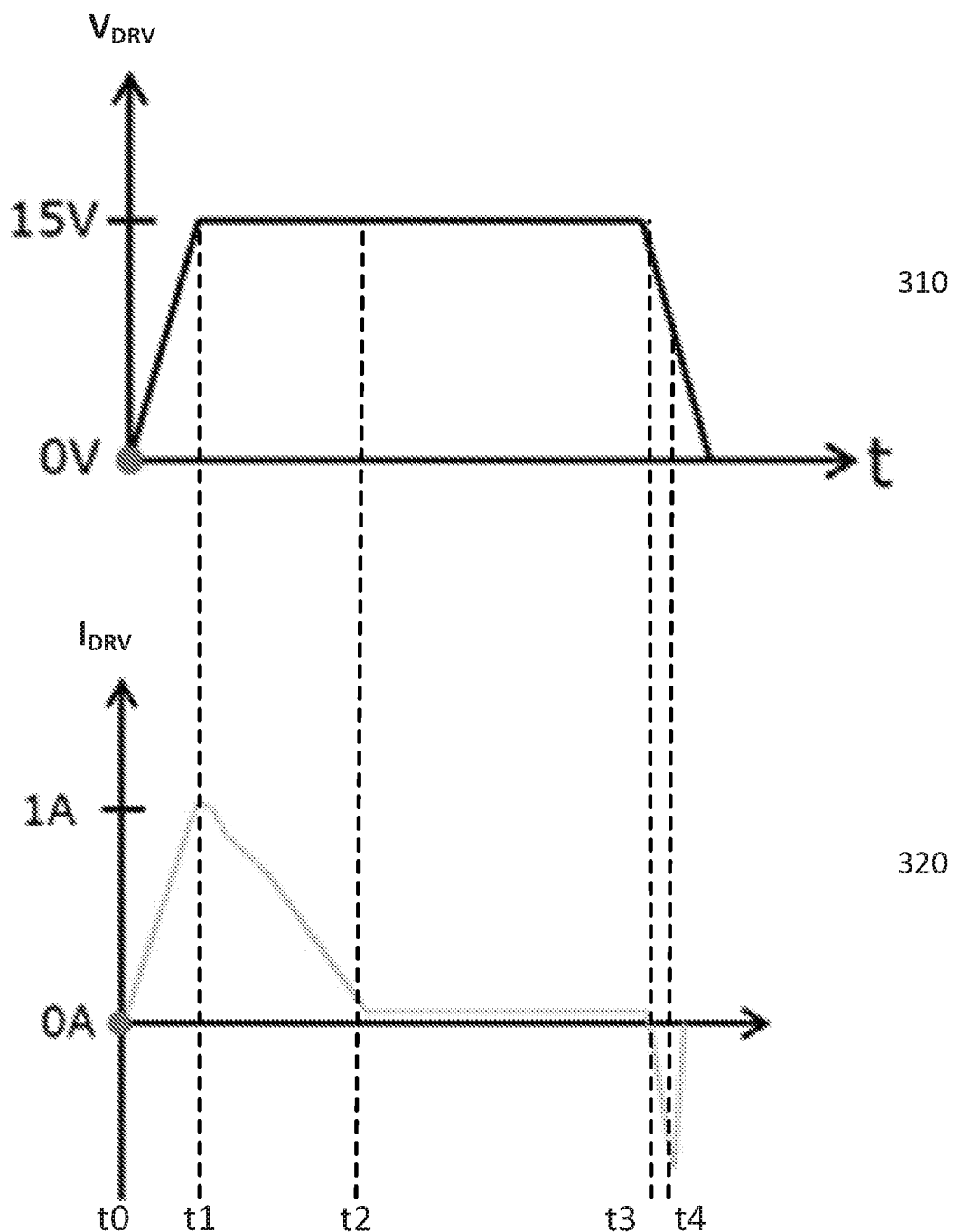
FIG. 3 illustrates voltage and current waveforms for a driver of the device of FIG. 1 for a turn-on interval.

Further explanation of the functionality of the power switch device 100 is provided in conjunction with FIG. 3, which illustrates current and voltage waveforms 310, 320 for an on-state interval of the power switch device 100, and FIGS. 4A-4E, which illustrate corresponding current paths at different instances of time. The circuitry of FIGS. 4A-4E is similar to that of FIG. 1, but additionally includes an external driver 160, which provides a drive voltage $V_{DRV}$ and a drive current $I_{DRV}$. For ease of illustration, the circuits of FIGS. 4A-4E do not explicitly show the demarcation of the time-programmable failsafe pulldown 120, but the underlying circuitry of the power switch device 100 is unchanged.

Figure 4A:
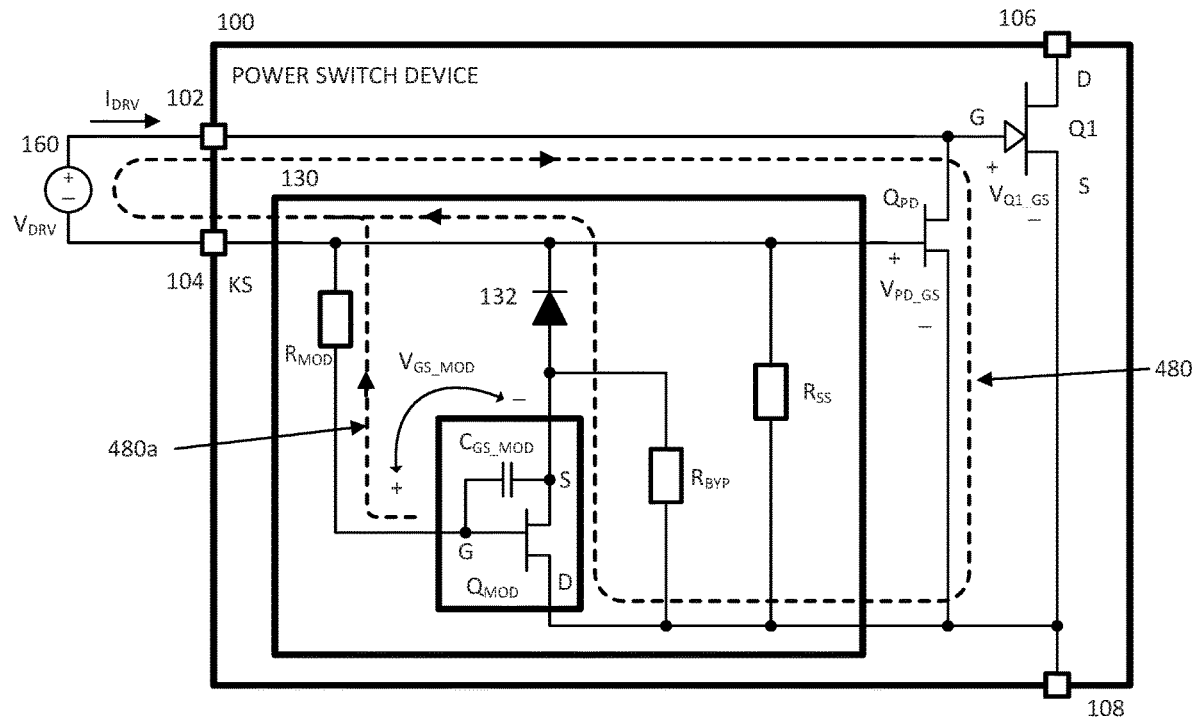
FIGS. 4A-4E illustrate current flows within the power switch device of FIG. 1 for different time instances associated with a turn-on interval of the device.
Figure 4B:
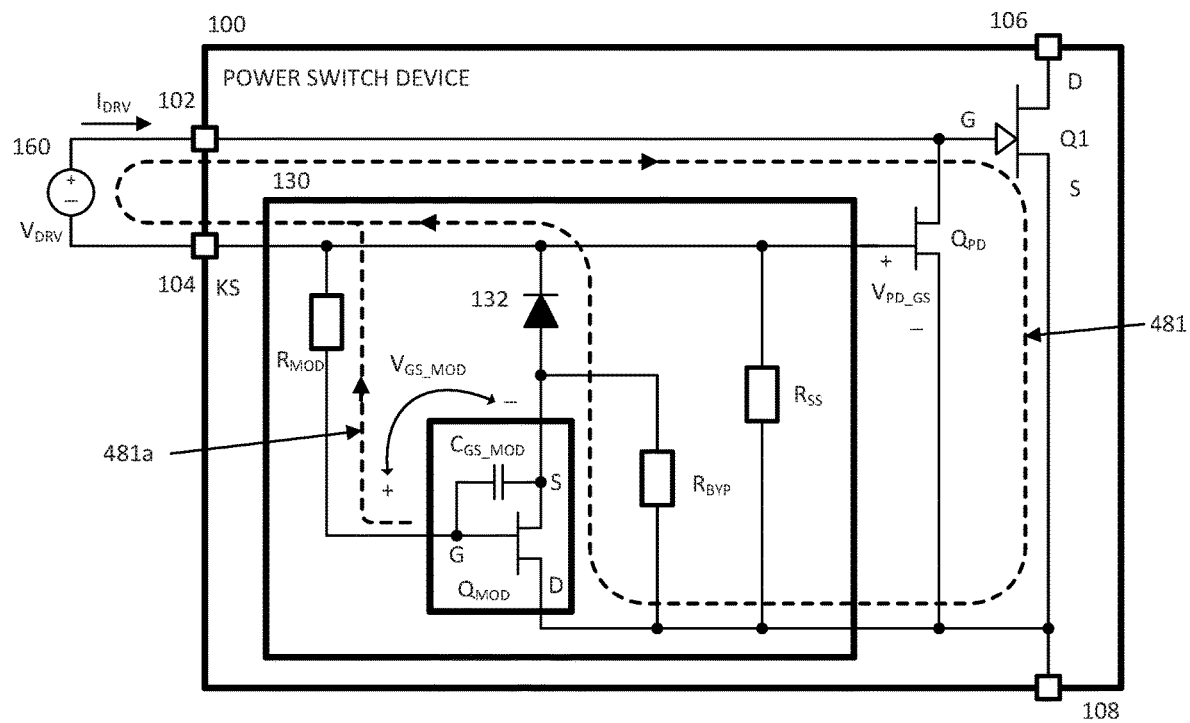
Figure 4C:
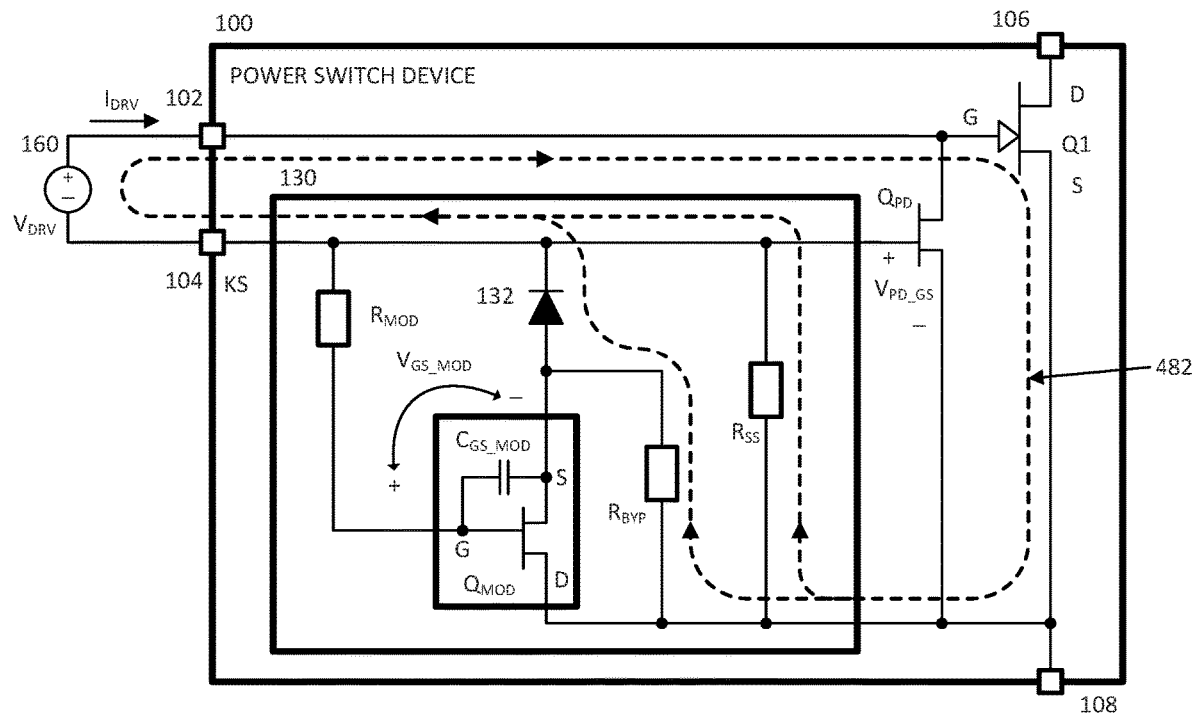

At time t0, the driver 160 begins ramping the drive voltage $V_{DRV}$ from 0V. In this initial state, the normally-on pulldown switch $Q_{PD}$ is conducting, thereby shorting the gate and source of the power switch Q1 such that Q1 does not conduct. The normally-on modulation switch $Q_{MOD}$ is in its conducting state, but with no initial current flow as $V_{DRV}$=0V. As the drive voltage $V_{DRV}$ increases, drive current $I_{DRV}$ begins flowing through the pulldown switch $Q_{PD}$, so as to charge the effective capacitance of the voltage clamp 132 (diode). The pulldown resistor $R_{SS}$ presents a higher impedance path than the charging of the voltage clamp 132, such that minimal current flows through pulldown resistor $R_{SS}$. The resultant current path 480 during this period when the pulldown switch $Q_{PD}$ is conducting is illustrated in FIG. 4A. While the forward threshold voltage of the voltage clamp 132 is not yet reached, the voltage drop that is building across the voltage clamp 132 generates a small current flow 480a that begins sinking charge, via modulation resistor $R_{MOD}$, from the gate capacitance $C_{GS\_MOD}$ of the modulation switch $Q_{MOD}$.

The illustrated current flow 480 causes the voltage drop across the voltage clamp 132 to rise which, in turn, generates a negative voltage $V_{PD\_GS}$ at the gate of the pulldown switch $Q_{PD}$. (With the modulation switch $Q_{MOD}$ in its fully on conducting state, the voltage clamp 132 and the pulldown gate-to-source junction have substantially the same voltage across them.) Once the pulldown gate-to-source voltage becomes sufficiently negative, e.g., $V_{PD\_GS}$<−7V, the pulldown switch $Q_{PD}$ turns off, such that the low-impedance path between the gate and the source of the power switch Q1 is blocked. The driver current $I_{DRV}$ then flows to the gate (G) of the power switch Q1, as shown in the current path 481 of FIG. 4B.

Once the drive voltage $V_{DRV}$ reaches a turn-on level (e.g., 13V) corresponding to the clamp voltage $V_{CL}$ (e.g., 10V) and the turn-on threshold voltage (e.g., 3V) of the power switch Q1, the voltage clamp 132 is forward biased. Current flows into the gate (G) of the power switch Q1 and the power switch Q1 begins to turn on. This is shown at time t1 in FIG. 3 and in the current loop 481 shown in FIG. 4B. The modulation switch $Q_{MOD}$ is still conducting. A low-impedance path is provided, via the modulation switch $Q_{MOD}$ and the voltage clamp 132, between the source (S) of the power switch Q1 and the reference control terminal 104. The resistance through the resistance modulation circuit 130 is negligible at time t1, and the charging current $I_{DRV}$ provided to the gate (G) of the power switch Q1 is limited primarily by the drive capability of the driver 160. Unlike prior solutions, there is no current-limiting resistor (component) that undesirably throttles the charging current or an RC network which is consumes energy as well as space.

Prior to time t0, the gate-to-source voltage $V_{GS\_MOD}$ of the modulation switch $Q_{MOD}$ is about 0V. After time t0, this voltage $V_{GS\_MOD}$ begins increasing in magnitude, but with a negative polarity, as current is sunk, via path 480a, from the gate of the modulation switch $Q_{MOD}$. By time t1, the voltage across the voltage clamp 132 has reached, and is clamped at, its threshold value, e.g., 10V. This increases the magnitude of current being sunk (and the related rate of charge depletion) from the gate of the modulation switch $Q_{MOD}$ through the modulation resistor $R_{MOD}$, via the current path 481a. The gate voltage $V_{GS\_MOD}$ becomes more negative as a result of the charge drawn from the gate of the modulation switch. Once this voltage $V_{GS\_MOD}$ decays to a level that is below the turn-off threshold (e.g., −7V) of the modulation switch $Q_{MOD}$, the modulation switch $Q_{MOD}$ will turn off. The time interval, e.g., t0 to t1 in FIG. 2, between when the driver 160 initially starts ramping the drive voltage $V_{DRV}$ and when the modulation switch $Q_{MOD}$ turns off is determined from the time constant $R_{MOD}*C_{GS\_MOD}$ and the turn-off threshold of the modulation switch $Q_{MOD}$. In a typical example, the gate capacitor $C_{GS\_MOD}$ may have a capacitance of around 10 pF, whereas the modulation resistance $R_{MOD}$ may have a resistance around 2 kOhms. A large resistance for the modulation resistor $R_{MOD}$ will hold the modulation switch $Q_{MOD}$ in its conducting state longer, thereby extending the duration of the high-current levels provided to the power switch Q1. A smaller resistance for the modulation resistor $R_{MOD}$ will more quickly reduce the gate voltage $V_{GS\_MOD}$ and turn the modulation switch $Q_{MOD}$ off quicker, resulting in a shorter high-current pulse.

At time t2 of FIG. 3, the modulation switch $Q_{MOD}$ switches off (is not conducting), such that the low-impedance path through the modulation switch $Q_{MOD}$ is blocked. Instead, current flows through the higher-impedance path that includes bypass and steady-state resistors $R_{BYP}$ and $R_{SS}$, as shown by the current path 482 of FIG. 4C. The resultant impedance seen across the control and control reference terminals 102, 104 is significantly higher than the impedance when the modulation switch $Q_{MOD}$ was conducting. This results in the relatively low level of the drive current $I_{DRV}$ between times t2 and t3 of FIG. 3, e.g., on the order of 8 mA vs. the approximately 1A peak current provided when transitioning the power switch Q1 to its on state. The low current level is determined by the applied drive voltage $V_{DRV}$, the threshold voltage $V_{Q1\_THR}$ of the power switch Q1, the clamp voltage $V_{CL}$, and the resistances $R_{BYP}$, $R_{SS}$. The resistance $R_{BYP}$ and/or $R_{SS}$ may be adjusted to program the current level for maintaining the on state of the power switch Q1, but it should be noted that the resistance $R_{SS}$ typically has the largest impact on the level of the maintenance current.

Figure 4D:
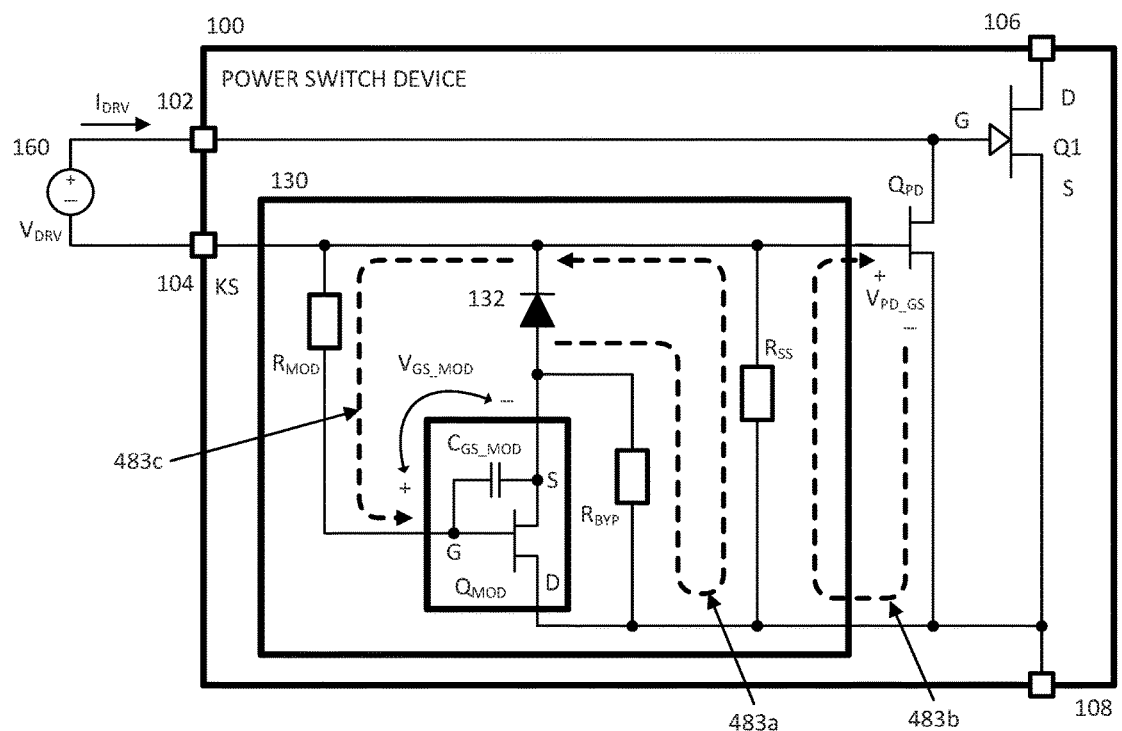

FIG. 4D illustrates current flows corresponding to time t3 in FIG. 3, which occurs shortly after the drive voltage $V_{DRV}$ begins to ramp down. More specifically, the time t3 is within an interval when the drive voltage $V_{DRV}$ is below the device turn-on threshold required to forward bias the voltage clamp 132 and maintain the power switch Q1 in its on state, e.g., a turn-on threshold of $V_{CL}+V_{PD\_Q1}$=10V+3V, but before the drive voltage $V_{DRV}$ has reduced to a level at which the pulldown switch $Q_{PD}$ will turn on. During this interval around time t3 and as shown in FIG. 4D, current flows 483a from the anode of the voltage clamp (diode) 132 to its cathode via resistors $R_{BYP}$, $R_{SS}$. This discharges the effective capacitance of the voltage clamp 132 and drives the voltage across the voltage clamp 132 towards zero.

This clamp voltage is in parallel with the modulation resistor $R_{MOD}$ and the modulation switch gate capacitance $C_{GS\_MOD}$. As the clamp voltage decreases, current 483c flows through $R_{MOD}$, so as to equalize the (negative) voltage $V_{GS\_MOD}$ across the gate-source junction of the modulation switch $Q_{MOD}$. The magnitude of the negative gate charge of the modulation switch $Q_{MOD}$ is reduced by this current flow 483c.

Figure 4E:
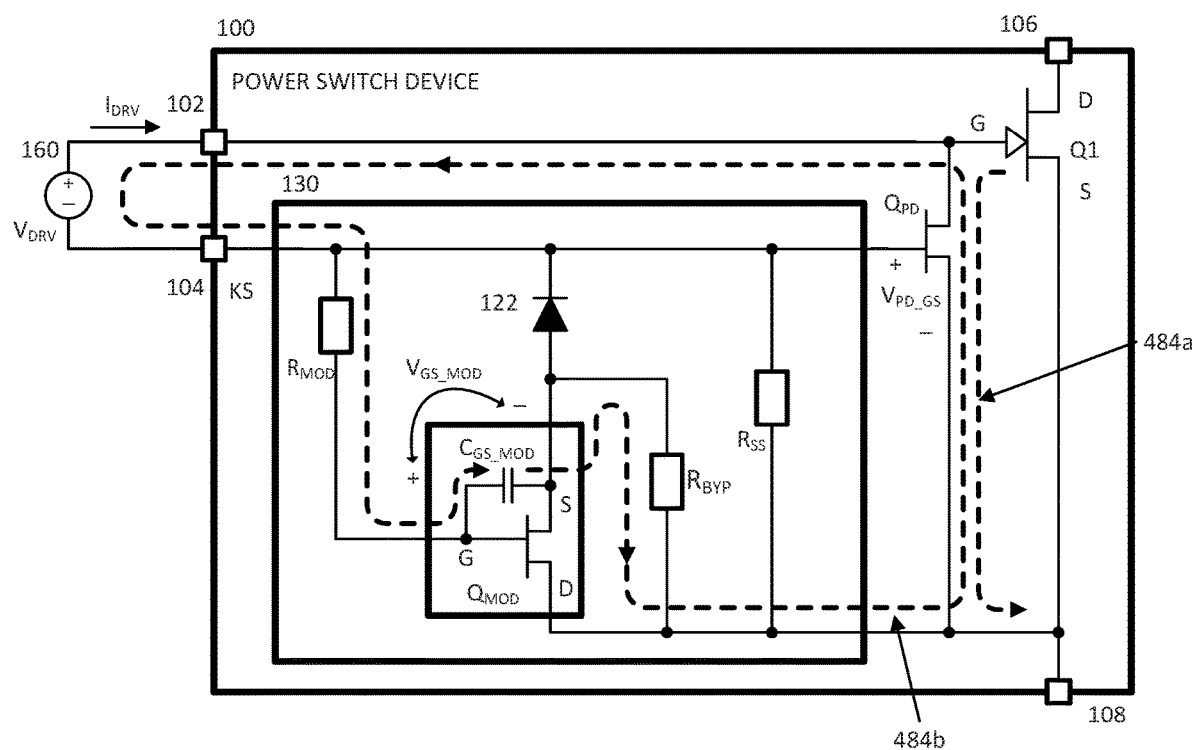

Also as the clamp voltage discharges towards zeros, charge across the gate-to-source junction of the pulldown switch $Q_{PD}$ equalizes via a current flow 483b from the pulldown source to the pulldown gate via the resistor $R_{SS}$. For example, the pulldown gate-to-source voltage $V_{PD\_GS}$ of −10V, as may exist between times t1 and t3 so as to hold the pulldown switch $Q_{PD}$ in its blocking state, rises towards 0V after time t3 due, at least in part, to the current flow 483*b*. Once the pulldown gate-to-source voltage $V_{PD\_GS}$ rises to a value higher than a turn-on/off threshold $V_{PD\_THR}$, e.g., $V_{PD\_GS} > V_{PD\_THR}$ (−7V), the pulldown switch $Q_{PD}$ turns on, thereby shorting the gate of the power switch Q1 to its source. FIG. 4E illustrates the resultant current flows, which correspond to the time t4 shown in FIG. 3.

With the pulldown switch $Q_{PD}$ conducting, current flows from the gate to the source of the power switch Q1 via the illustrated current path 484*a*, thereby discharging the gate charge of the power switch Q1, so as to turn off the power switch Q1. Additionally, any residual charge on the modulation switch capacitance $C_{GS\_MOD}$ is equalized via the current path 484*b*, which flows through bypass resistor $R_{SYP}$, pulldown switch $Q_{PD}$, driver 160, and modulation resistor $R_{MOD}$. This is shown as a negative driver current $I_{DRV}$ between times t3 and t4 in FIG. 3. At time t4, or shortly thereafter, the charge across the switch capacitance $C_{GS\_MOD}$ is substantially equalized, such that the modulation switch $Q_{MOD}$ has a gate-to-source voltage $V_{GS\_MOD}$ of approximately zero, thereby setting the modulation switch $Q_{MOD}$ to its conducting state in preparation for the next turn-on transition of the power switch Q1.

Figure 5:
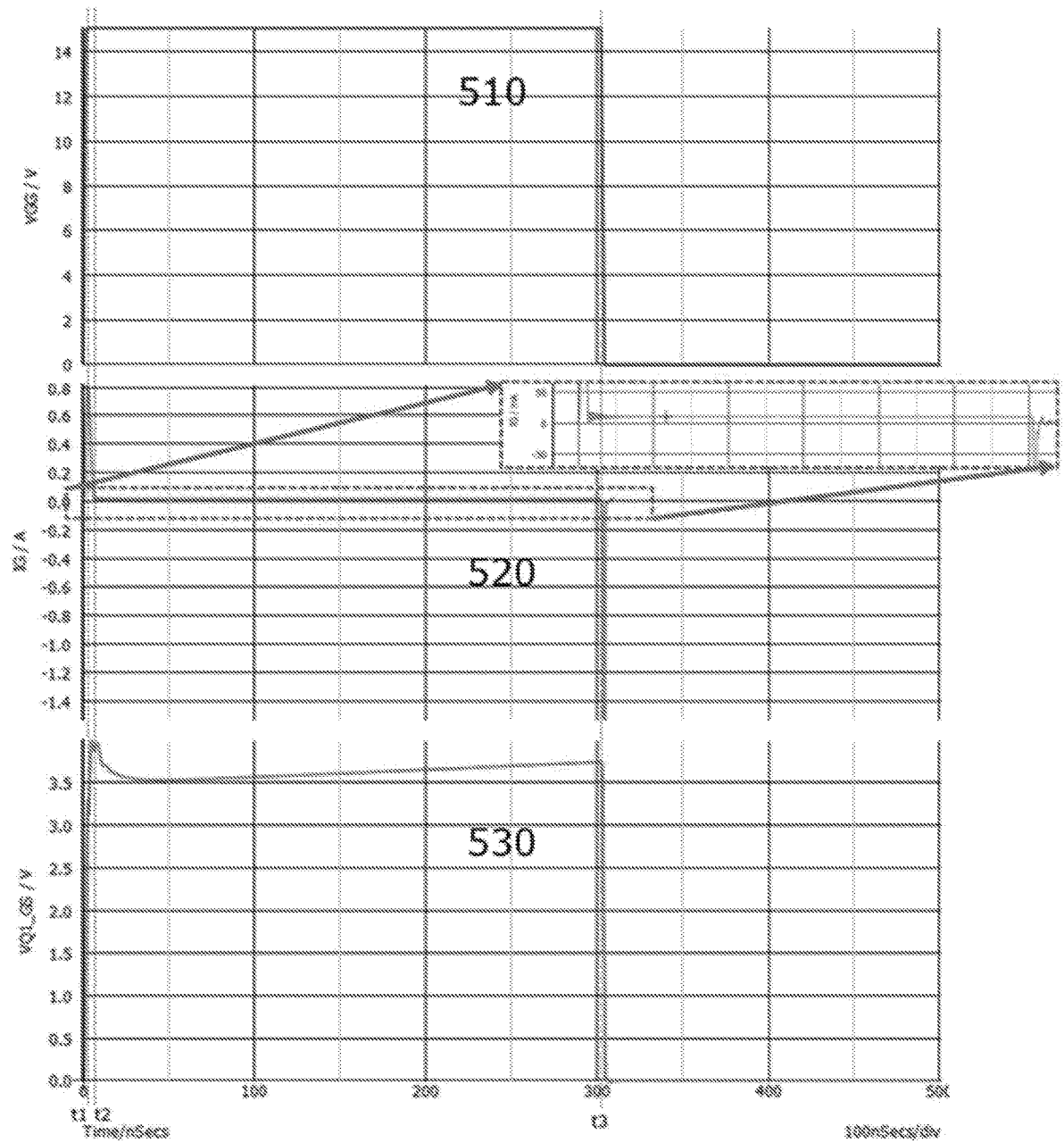
FIG. 5 illustrates voltage and current waveforms corresponding to the power switch device of FIG. 1.

FIG. 5 illustrates voltage and current waveforms corresponding to a simulation of a turn-on interval for the power switch device 100 of FIG. 1. Voltage waveform 510 corresponds to a voltage $V_{GG}$ applied across the control and control reference terminals 102, 104, whereas current waveform 520 corresponds to a current $I_G$ flowing into the control terminal 102 (gate of power switch Q1). A voltage waveform 530 corresponds to the gate-to-source voltage $V_{Q1\_GS}$ of the power switch Q1. At time t=0, the voltage $V_{GG}$ ramps from 0V towards its turn-on value of 15V, thereby generating a high-current pulse for the gate current $I_G$. The gate current $I_G$ rises quickly to about 800 mA, as shown at time t1. The gate voltage $V_{Q1\_GS}$ of the power switch Q1 rises above its threshold, e.g., 3V, at about time t1 and the power switch Q1 is turned on. With the power switch Q1 turned on thusly, the high current may then be reduced for a steady-state (maintenance) interval of the turn-on period. This is shown in the gate current $I_G$, which decays from its peak of 800 mA at time t1 to about 10 mA by time t2. The maintenance current level is maintained until time t3, at which point the control voltage $V_{GG}$ is driven to zero and the power switch Q1 turns off.

Power Switch Device System with External Driver

Figure 6:
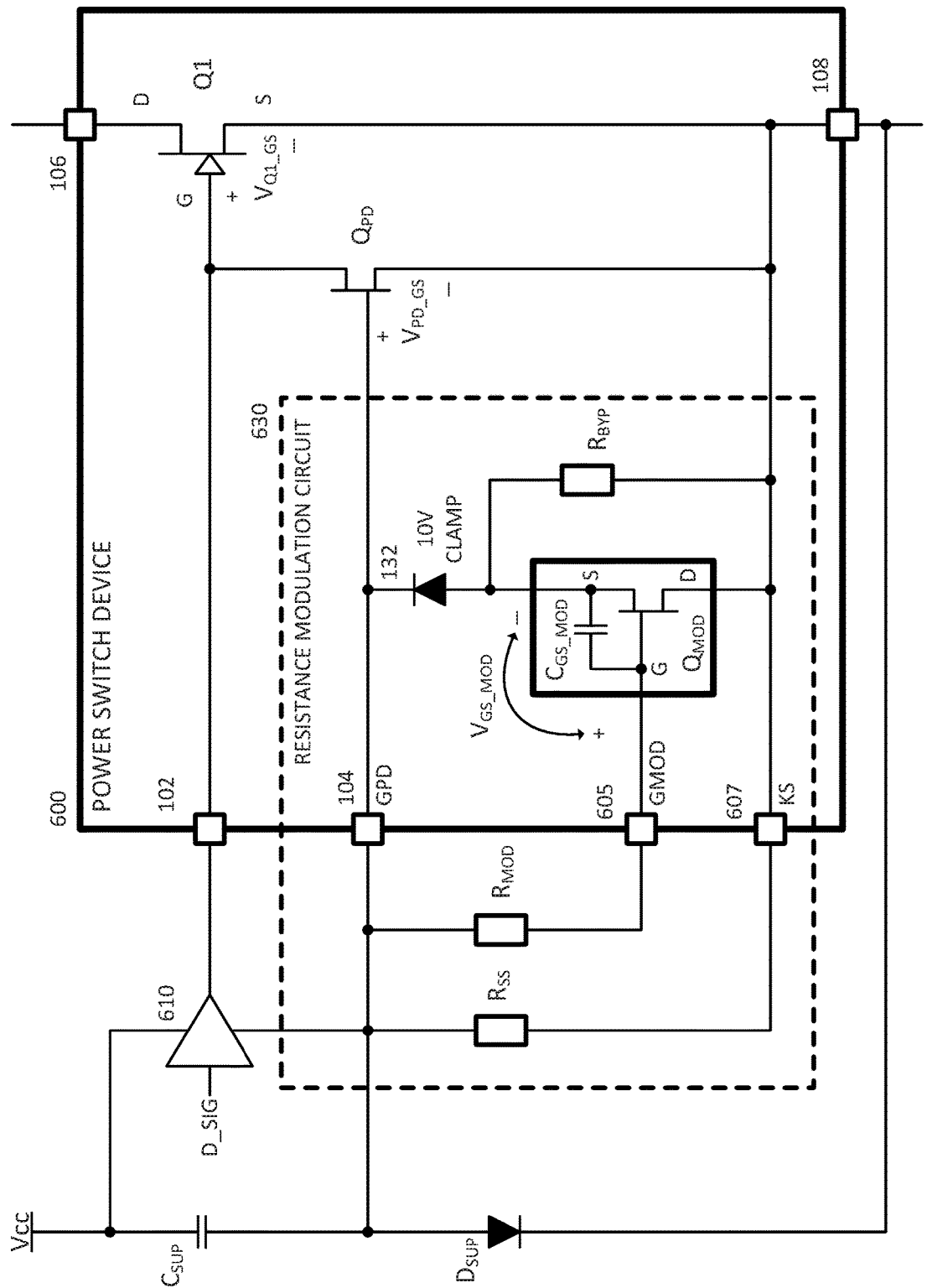
FIG. 6 illustrates a power switch system including an alternative power switch device in which programmability of the effective gate resistance is accomplished using resistors that are external to the power switch device, and that is driven by an external single-channel driver.

FIG. 6 illustrates a switch device system, including a power switch device 600 and an external driver 610. The driver 610 does not need to include multiple channels to provide different current drive levels, or to provide multiple voltage levels, e.g., negative voltages as provided by prior GIT drivers. Hence, the driver 610 may be a single-channel driver providing two voltage levels (e.g., 0 and 15V), which is similar or the same as drivers used, e.g., with conventional MOSFETs.

As illustrated, the power switch device 600 is a 6-terminal device implemented in a GaN die. The circuitry of the power switch device 600 is the same as the circuitry 100 of FIG. 1, but the modulation and steady-state resistors $R_{MOD}$, $R_{SS}$ are provided external to the power switch device 600. This allows for the duration of the high-current turn-on pulse to be easily tuned by changing the modulation resistor $R_{MOD}$, without having to alter the GaN die. Similarly, the steady-state (maintenance) current provided to the power transistor Q1 may be easily tuned by changing the resistor $R_{SS}$, again without altering the GaN die. As illustrated by the dotted box 630, the resistance modulation circuit has the same topology as the corresponding circuit 130 of FIG. 1, but the component partitioning differs in FIG. 6. The power switch Q1, pulldown switch $Q_{PD}$, modulation switch $Q_{MOD}$, voltage clamp 132, and bypass resistor $R_{BYP}$ may be monolithically integrated in the same GaN die.

Unlike the power switch device 100 of FIG. 1, the power switch device 600 provides a modulation terminal 605 (GMOD), which is configured such that a modulation resistor $R_{MOD}$ coupled between the modulation terminal 605 and the pulldown gate terminal 104 (GPD) determines the duration of the high-current turn-on transition pulse, as described previously. Additionally, the power switch device 600 provides a Kelvin-source terminal 607 (KS), which is configured such that a steady-state current-setting resistor $R_{SS}$ coupled between the KS terminal 607 and the pulldown gate terminal 104 (GPD) determines the level of the steady-state current used to maintain the power switch Q1 in its conducting state. The KS terminal 607 differs, generally, from the source terminal 108 in that the KS terminal 607 is not configured to handle high load currents. In some applications, the KS terminal 607 may be eliminated and the source load terminal 108 may be used for connection to the steady-state resistor $R_{SS}$, such that the resultant power switch device is a 5-terminal device.

The driver 610 inputs a digital waveform, such as a pulse-width-modulated (PWM) signal D_SIG. The signal D_SIG may alternative between TTL (transistor-transistor logic) or CMOS (complementary MOSFET) levels, such as 0 and 3.3V, 0 and 5V, etc. As illustrated, the driver 610 is powered from a power supply Vcc or with a bootstrap configuration, such that the power switch device 600 may be a high-side switch of a half bridge or similar circuit. The supply capacitor $C_{SUP}$ is charged from Vcc during periods when the source terminal 108 is grounded. The blocking diode $D_{SUP}$ is required to block the voltage of the 10V clamp; if the negative terminal of the supply capacitor $C_{SUP}$ were coupled directly to the source load terminal 108, the current from supply capacitor $C_{SUP}$ would bypass the resistance modulation circuit 630 by flowing through the pulldown switch $Q_{PD}$.

Power Switch Device with Integrated Driver

Figure 7:
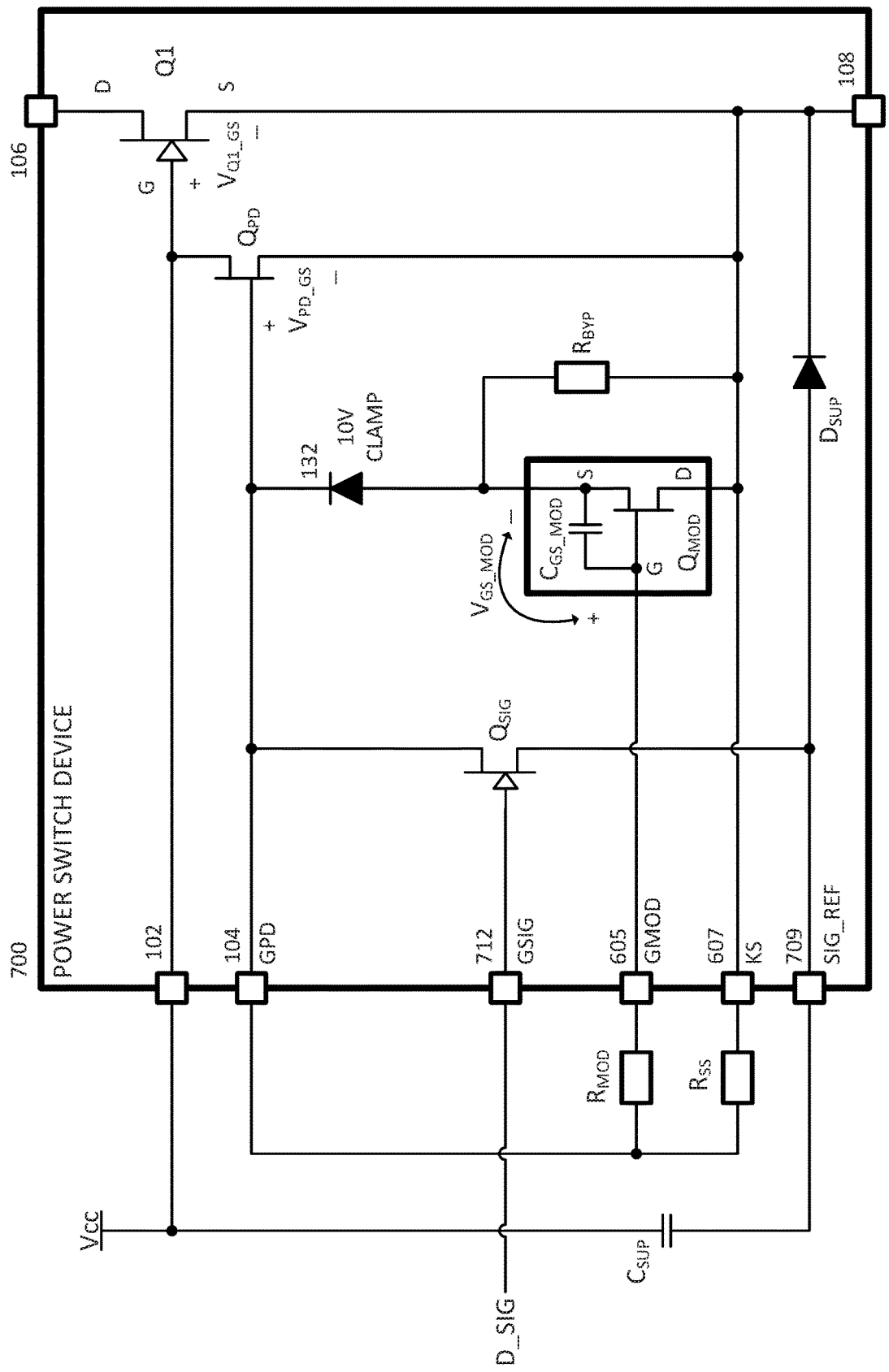
FIG. 7 illustrates a power switch device that incorporates driver circuitry and requires no external driver.

FIG. 7 illustrates a power switch device 700 that includes an integrated driver. The system of FIG. 7 is similar to that of FIG. 6, except that the external driver 610 is eliminated. The power switch device 700 additionally includes a control terminal 712 (GSIG) for inputting a digital control signal D_SIG, e.g., a PWM signal having digital levels relative to a reference (SIG_REF) terminal 709. The power switch device 700 includes a signal switch $Q_{SIG}$, which has a gate (control terminal) coupled to the input control terminal 712. As illustrated, the signal switch $Q_{SIG}$ is a normally-off GIT, as is the power switch Q1. While the signal switch $Q_{SIG}$ is integrated in the same GaN die as the power switch Q1, etc., the signal switch $Q_{SIG}$ may be considerably smaller than the power switch Q1, since the signal switch $Q_{SIG}$ need not support the high load current levels that flow through the power switch Q1. For example, the signal switch $Q_{SIG}$ may have fewer channels (fingers) and/or reduced channel thickness relative to the power switch Q1. (Likewise, the normally-on pulldown switch $Q_{PD}$ and the normally-on modulation switch $Q_{MOD}$ may be dimensioned to support smaller currents than the power switch Q1.)

The blocking diode $D_{SUP}$ serves much the same purpose as in FIG. 6, but is integrated within the GaN die of the power switch device 700. For example, the blocking diode $D_{SUP}$ may be a GaN-based gated diode or a GaN-based PN diode, as described previously.

A power supply Vcc is coupled to the gate terminal 102 and, in conjunction with the supply capacitor $C_{SUP}$, provides a supply voltage between the gate terminal 102 and the signal/supply reference terminal 709 (SIG_REF). As similarly explained previously, application of a turn-on voltage between the control terminal 102 and the control reference terminal 104 turns on the power switch Q1. (The turn-on voltage is higher than a summation of the threshold voltage of the power switch Q1 and a forward bias voltage of the voltage clamp 132. For a 3V threshold voltage and a 10V forward bias threshold, a Vcc of 15V is sufficient, as described previously.) For the power switch device 700 of FIG. 7, the node corresponding to the control reference terminal 104 is switchably connected to the signal/supply reference terminal 709 using the signal switch $Q_{SIG}$. When the signal switch $Q_{SIG}$ is turned on, the voltage Vcc is effectively applied across the control terminal 102 and the control reference terminal 104, via signal switch $Q_{SIG}$ and signal/supply reference terminal 709 (SIG_REF), so as to turn on the power switch Q1. When the signal switch $Q_{SIG}$ is turned off, no voltage is applied across the control terminal 102 and the control reference terminal 104, the normally-off pulldown switch $Q_{PD}$ shorts the gate and source of the power switch Q1, and the power switch Q1 is held in its off state.

In summary, a positive voltage of D_SIG that is higher than the turn-on threshold of the signal switch $Q_{SIG}$ results in the power switch Q1 being turned on. Otherwise, the power switch Q1 is turned off. A typical turn on/off threshold for a GIT, such as the signal switch $Q_{SIG}$, is 1.2 to 3.5V. Hence, application of typical TTL or CMOS levels, e.g., 0V and 3.3 to 5V, between the signal terminal 712 (GSIG) and the signal/supply reference terminal 709 (SIG_REF) may be used to control the power switch device 700.

While TTL and CMOS levels may provide sufficient voltages to drive the power switch device 700, typical TTL and CMOS digital outputs may not provide adequate current to transition the signal switch $Q_{SIG}$ to its conducting state within an acceptable time interval. Applications requiring relatively fast turn on and turn off of a power switch device may require a more complex driver than the simple signal switch $Q_{SIG}$ of the power switch device in FIG. 7.

Figure 8:
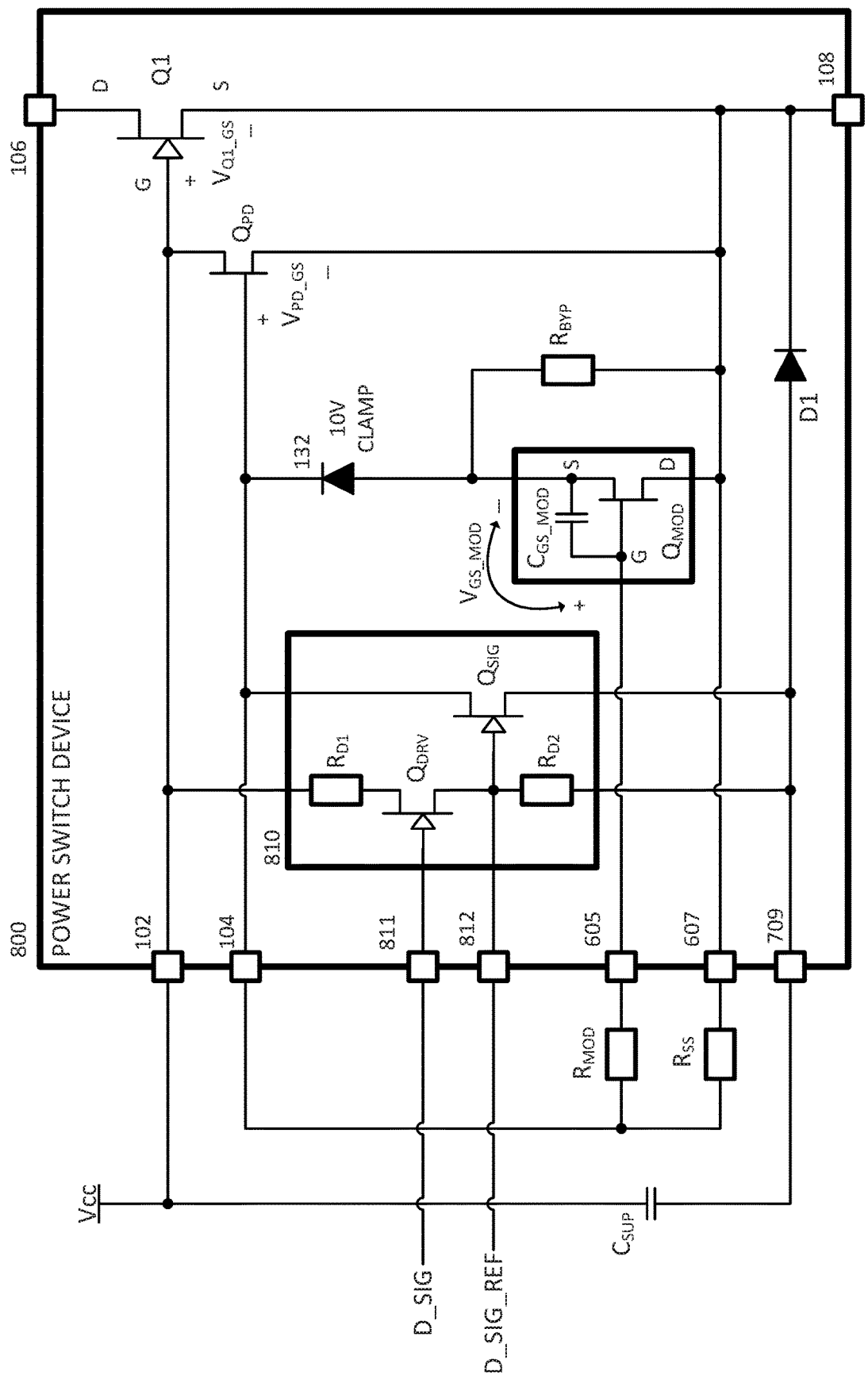
FIG. 8 illustrates another power switch device that incorporates driver circuitry and also requires no external driver.

FIG. 8 illustrates a power switch device 800 that provides additional drive current, such that the signal switch $Q_{SIG}$ may be transitioned on more quickly. The power supply Vcc is used to supply this drive current for turning on the signal switch $Q_{SIG}$, rather than relying upon the digital input signal D_SIG.

The power switch device 800 is similar to that of FIG. 7, but includes a more complex driver 810. In addition to a signal switch $Q_{SIG}$, the driver 810 includes an amplifier circuit having a drive switch $Q_{DRV}$ and a resistor divider including resistors $R_{D1}$, $R_{D2}$. The power switch device 800 has differential input terminals 811, 812 for inputting differential signals D_SIG, D_SIG_REF. A positive control voltage that is higher than the turn-on threshold of the driver switch $Q_{DRV}$ and that is applied between the signals D_SIG, D_SIG_REF results in the driver switch $Q_{DRV}$ conducting. The resistors $R_{D1}$, $R_{D2}$ are configured such that a resultant voltage across the gate-source junction of the signal switch $Q_{SIG}$ is sufficient to turn on the signal switch. For example, with a supply voltage Vcc=15V, the resistors $R_{D1}$, $R_{D2}$ may be chosen to provide a division by 3, such that 5V is driven across the gate and source of the signal switch $Q_{SIG}$ when driver switch $Q_{DRV}$ is conducting. Current from the power supply Vcc charges, via the resistor $R_{D1}$ and the driver switch $Q_{DRV}$, the gate of the signal switch $Q_{SIG}$, so as to turn the signal switch $Q_{SIG}$ on. This, in turn, turns on the power switch Q1 in the same manner as describe above. When a differential control voltage of the input signals D_SIG, D_SIG_REF is below the turn-on/off threshold of the driver switch $Q_{DRV}$, e.g., the differential voltage is 0V, the driver switch $Q_{DRV}$ turns off, thereby isolating the gate of the signal switch $Q_{SIG}$ from the power supply Vcc. The accumulated charge on the gate of the signal switch $Q_{SIG}$ is discharged via resistor $R_{D2}$, and the signal switch $Q_{SIG}$ turns off. This, in turn, leads to the transitioning off of the power switch Q1, in the same manner as described previously.

While two specific examples have been described for providing a driver that is integrated within a GaN die that includes the power switch Q1, it should be recognized that numerous other driver circuit topologies are possible. In one variation of the driver 810, a pulldown switch may be coupled in parallel to the resistor $R_{D2}$ and be used to provide a lower-impedance path for discharging the gate of the signal switch $Q_{SIG}$. As another example, the amplifier of the driver 810 could be replaced with a half-bridge (push-pull) driver for driving the signal switch $Q_{SIG}$.

Although the present disclosure is not so limited, the following numbered examples demonstrate one or more aspects of the disclosure.

Example 1

A power switch device includes a normally-off power transistor, a control terminal, a control reference terminal, a normally-on pulldown transistor and a resistance modulation circuit. The normally-off power transistor has a gate, a source and a drain, and the control terminal is connected to the gate. The pulldown transistor is configured to short the gate to the source when no voltage is applied between the control terminal and the control reference terminal, and has a pulldown gate, a pulldown source, and a pulldown drain. The resistance-modulation circuit is coupled between the source and the control reference terminal, and includes a modulation transistor. This circuit is configured to modulate a resistance between the control terminal and the control reference terminal, such that a charging current is provided to the gate, for a predetermined charging interval, responsive to application of a device turn-on voltage between the control terminal and the control reference terminal, and a maintenance current is provided to the gate after the predetermined charging interval. The maintenance current has a level that is lower than a level of the charging current.

Example 2

The power switch device of example 1, wherein the resistance-modulation circuit is further configured to autonomously apply a negative voltage to the pulldown gate, relative to the pulldown source, responsive to application of the device turn-on voltage, so as to turn off the normally-on pulldown transistor. The resistance-modulation circuit may also be configured to autonomously discharge the negative voltage when the device turn-on voltage is not applied between the control terminal and the control reference terminal.

Example 3

The power switch device of example 1, wherein the resistance-modulation circuit comprises a bypass resistor and a voltage clamp diode. The bypass resistor is connected in parallel with the modulation transistor. The modulation transistor and the voltage clamp diode are serially connected between the pulldown source and the pulldown gate, and provide a low impedance current path between them when the modulation transistor is conducting.

Example 4

The power switch device of example 3, wherein the modulation transistor has a modulation gate-to-source capacitance between a modulation gate and a modulation source. The predetermined charging interval is based upon the modulation gate-to-source capacitance and a modulation resistor coupled to the modulation gate.

Example 5

The power switch device of example 4, wherein the level of the maintenance current is based upon a resistance of a steady-state resistor coupled between the pulldown gate and the pulldown source.

Example 6

The power switch device of example 5, further comprising first and second resistor terminals. The first resistor terminal is electrically connected to the modulation gate and is configured for connection to the modulation resistor. The second resistor terminal is connected to the pulldown source and is configured for connection to the steady-state resistor. The modulation resistor and the steady-state resistor are external to the power switch device.

Example 7

The power switch device of example 1, wherein the normally-off power transistor is a Gate Injection Transistor (GIT), the normally-on pulldown transistor is a High Electron Mobility Transistor (HEMT), and the modulation transistor is a HEMT. The normally-off power transistor, the normally-on pulldown transistor, and the modulation transistor are monolithically integrated in the same die.

Example 8

The power switch device of example 7, wherein the die is a Gallium Nitride (GaN) die.

Example 9

The power switch device of example 7, further comprising a bypass resistor and a voltage clamp diode. The bypass resistor is connected in parallel with the modulation transistor. The voltage clamp diode is connected serially to the modulation transistor such that the serially-connected voltage clamp diode and modulation transistor are coupled between the pulldown source and the pulldown gate. The bypass resistor and the voltage clamp diode are monolithically integrated in the same die as the normally-off power transistor, the normally-on pulldown transistor, and the modulation transistor.

Example 10

The power switch device of example 9, further comprising a steady-state resistor and a modulation resistor. The steady-state resistor is coupled between the pulldown gate and the pulldown source. The modulation resistor is coupled between the pulldown gate and a gate of the modulation transistor. The steady-state resistor and the modulation resistor are monolithically integrated in the same die as the normally-off power transistor, the normally-on pulldown transistor, and the modulation transistor.

Example 11

The power switch device of example 10, wherein the die is a Gallium Nitride (GaN) die, and each of the bypass resistor, the steady-state resistor and the modulation resistor is comprised of a two-dimensional electron gas (2DEG) region of the GaN die. The voltage clamp diode is comprised of one or more GaN-based diodes, the one or more GaN-based diodes comprising at least one of a gated diode and a PN diode. A gated diode may be constructed by coupling the source and the gate of a GIT to form an anode, and the drain of the GIT forms a cathode. A PN diode may be constructed by coupling the source and drain of a GIT to form an cathode, and the gate of the GIT forms an anode.

Example 12

The power switch device of example 1, wherein the device turn-on voltage is a positive voltage that equals or exceeds a sum of a turn-on threshold voltage of the normally-off power transistor and a magnitude of a turn-off threshold voltage of the normally-on pulldown transistor.

Example 13

A power switch device system including the power switch device of example 1, wherein the system further includes a single-channel external driver that is powered by a driver power supply. This driver includes an input terminal for inputting a digital control signal and an output terminal for outputting an output voltage. The output terminal is connected to the control terminal of the power switch device, and the output voltage alternates between two levels based upon the digital control signal.

Example 14

A power switch device with an integrated driver includes a normally-off power transistor, first and second load terminals, supply and supply reference terminals, a control terminal, a normally-on pulldown transistor, an integrated driver, and a resistance-modulation circuit. The normally-on power transistor includes a drain, which is connected to the first load terminal, a source, which is connected to the second load terminal, and a gate. The supply and supply reference terminals are configured for connection to an external power supply. The control terminal is configured to input a digital control signal that controls conduction between the first and second load terminals. The normally-on pulldown transistor has a pulldown gate, a pulldown source, and a pulldown drain, and is configured to short the gate and source of the power transistor when the digital control signal does not command conduction of the power switch device. The integrated driver circuit is configured to source current to and/or sink current from the pulldown gate so as to control current conduction of the normally-on pulldown transistor, based upon the digital control signal. The resistance-modulation circuit is coupled between the source and the supply reference terminal, and includes a modulation transistor. This circuit is configured to modulate a resistance between the supply terminal and the supply reference terminal, such that a charging current is provided to the gate, for a predetermined charging interval, responsive to the digital control signal transitioning to command conduction, and a maintenance current is provided to the gate after the predetermined charging interval. The maintenance current has a level that is lower than a level of the charging current.

Example 15

The power switch device with integrated driver of example 14, wherein the integrated driver circuit comprises a driver switch that switchably couples the pull-down gate to the supply reference terminal, and wherein the coupling between the source and the supply reference terminal is via the driver switch.

Example 16

The power switch device with integrated driver of example 14, wherein the normally-off power transistor, the normally-on pulldown transistor, the integrated driver and the modulation transistor are monolithically integrated in a same die.

Example 17

The power switch device with integrated driver of example 16, wherein the same die is a Gallium Nitride (GaN) die, wherein the normally-off power transistor is a Gate Injection Transistor (GIT), wherein the normally-on pulldown transistor is a High-Electron Mobility Transistor (HEMT), wherein the modulation transistor is a HEMT, and wherein the integrated driver comprises at least one GIT and/or HEMT.

Example 18

The power switch device with integrated driver of example 16, wherein the integrated driver circuit comprises a GIT that is configured to short the pulldown gate to the supply reference terminal.

Example 19

The power switch device with integrated driver of example 16, further including first and second resistor terminals. The first resistor terminal is connected to a gate of the modulation transistor and is configured for connection to an external modulation resistor having a modulation resistance, wherein the predetermined charging interval is based upon the modulation resistance and a gate-to-source capacitance of the modulation transistor. The second resistor terminal is connected to the pulldown source and is configured for connection to a steady-state resistor having a steady-state resistance, wherein the level of the maintenance current is based upon the steady-state resistance.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power switch device, comprising:
    a normally-off power transistor comprising a gate, a source, and a drain;
    a control terminal electrically connected to the gate;
    a control reference terminal;
    a normally-on pulldown transistor configured to short the gate to the source when no voltage is applied across the control terminal and the control reference terminal, and comprising a pulldown gate, a pulldown source, and a pulldown drain; and
    a resistance-modulation circuit comprising a modulation transistor and coupled between the source and the control reference terminal, and configured to:
        modulate a resistance between the control terminal and the control reference terminal, such that a charging current is provided to the gate, for a predetermined charging interval, responsive to application of a device turn-on voltage between the control terminal and the control reference terminal, and a maintenance current is provided to the gate after the predetermined charging interval, wherein the maintenance current has a positive level that is lower than a level of the charging current,
    wherein the resistance-modulation circuit comprises:
        a bypass resistor connected in parallel with the modulation transistor; and
        a voltage clamp diode,
    wherein the modulation transistor and the voltage clamp diode are serially connected between the pulldown source and the pulldown gate.

2. The power switch device of claim 1, wherein the resistance-modulation circuit is further configured to:
    autonomously apply a negative voltage to the pulldown gate, relative to the pulldown source, responsive to application of the device turn-on voltage, so as to turn off the normally-on pulldown transistor; and
    autonomously discharge the negative voltage when the device turn-on voltage is not applied between the control terminal and the control reference terminal.

3. The power switch device of claim 1,
    wherein the modulation transistor has a modulation gate-to-source capacitance between a modulation gate and a modulation source, and
    wherein the predetermined charging interval is based upon the modulation gate-to-source capacitance and a modulation resistor coupled to the modulation gate.

4. The power switch device of claim 3, wherein the level of the maintenance current is based upon a resistance of a steady-state resistor coupled between the pulldown gate and the pulldown source.

5. The power switch device of claim 4, further comprising:
    a first resistor terminal electrically connected to the modulation gate and configured for connection to the modulation resistor, wherein the modulation resistor is external to the power switch device; and a second resistor terminal connected to the pulldown source and configured for connection to the steady-state resistor, wherein the steady-state resistor is external to the power switch device.

6. The power switch device of claim 1,
wherein the normally-off power transistor is a Gate Injection Transistor (GIT),
wherein the normally-on pulldown transistor is a High Electron Mobility Transistor (HEMT),
wherein the modulation transistor is a HEMT, and
wherein the normally-off power transistor, the normally-on pulldown transistor, and the modulation transistor are monolithically integrated in a same die.

7. The power switch device of claim 6, wherein the same die is a Gallium Nitride (GaN) die.

8. The power switch device of claim 6,
wherein the bypass resistor and the voltage clamp diode are monolithically integrated in the same die as the normally-off power transistor, the normally-on pulldown transistor, and the modulation transistor.

9. The power switch device of claim 8, further comprising:
a steady-state resistor coupled between the pulldown gate and the pulldown source; and
a modulation resistor coupled between the pulldown gate and a gate of the modulation transistor,
wherein the steady-state resistor and the modulation resistor are monolithically integrated in the same die as the normally-off power transistor, the normally-on pulldown transistor, and the modulation transistor.

10. The power switch device of claim 9,
wherein the same die is a Gallium Nitride (GaN) die,
wherein each of the bypass resistor, the steady-state resistor and the modulation resistor is comprised within the GaN die,
wherein the voltage clamp diode includes one or more GaN-based resistors, one or more GaN-based capacitors, and one or more GaN-based diodes, the one or more GaN-based diodes comprising at least one of:
a gated diode, in which a source and a gate of a normally-off GaN HEMT are coupled with one or more PN diodes to form an anode, and a drain of said GaN HEMT forms a cathode, and
PN diode, in which a source and a drain of a normally-off GaN HEMT are coupled together to form an cathode, and a gate of said GaN HEMT forms an anode.

11. The power switch device of claim 1, wherein the device turn-on voltage is a positive voltage that equals or exceeds a sum of a turn-on threshold voltage of the normally-off power transistor and a magnitude of a turn-off threshold voltage of the normally-on pulldown transistor.

12. A power switch device system, comprising:
a power switch device; and
a single-channel external driver that is powered by a driver power supply, and comprising:
an input terminal for inputting a digital control signal; and
an output terminal for outputting an output voltage,
wherein the power switch device comprises:
a normally-off power transistor comprising a gate, a source, and a drain;
a control terminal electrically connected to the gate;
a control reference terminal;
a normally-on pulldown transistor configured to short the gate to the source when no voltage is applied across the control terminal and the control reference terminal, and comprising a pulldown gate, a pulldown source, and a pulldown drain; and
a resistance-modulation circuit comprising a modulation transistor and coupled between the source and the control reference terminal, and configured to modulate a resistance between the control terminal and the control reference terminal, such that a charging current is provided to the gate, for a predetermined charging interval, responsive to application of a device turn-on voltage between the control terminal and the control reference terminal, and a maintenance current is provided to the gate after the predetermined charging interval, wherein the maintenance current has a positive level that is lower than a level of the charging current,
wherein the output terminal is connected to the control terminal of the power switch device, and
wherein the output voltage alternates between two levels based upon the digital control signal.

13. A power switch device with integrated driver, comprising:
a normally-off power transistor comprising a gate, a source, and a drain;
a first load terminal electrically connected to the drain;
a second load terminal electrically connected to the source;
a supply terminal and a supply reference terminal for connection to a power supply;
a control terminal configured to input a digital control signal that controls conduction between the first and second load terminals;
a normally-on pulldown transistor comprising a pulldown gate, a pulldown source, and a pulldown drain, and configured to short the gate to the source when the digital control signal does not command conduction of the power switch device;
an integrated driver circuit configured to control conduction of the normally-on pulldown transistor, based upon the digital control signal; and
a resistance-modulation circuit comprising a modulation transistor and coupled between the source and the supply reference terminal, and configured to:
modulate a resistance between the supply terminal and the supply reference terminal, such that a charging current is provided to the gate, for a predetermined charging interval, responsive to the digital control signal transitioning to command conduction, and a maintenance current is provided to the gate after the predetermined charging interval, wherein the maintenance current has a positive level that is lower than a level of the charging current.

14. The power switch device with integrated driver of claim 13, wherein the integrated driver circuit comprises a driver switch that switchably couples the pull-down gate to the supply reference terminal, and wherein the coupling between the source and the supply reference terminal is via the driver switch.

15. The power switch device with integrated driver of claim 13, wherein the normally-off power transistor, the normally-on pulldown transistor, the integrated driver and the modulation transistor are monolithically integrated in a same die.

16. The power switch device with integrated driver of claim 15,
wherein the same die is a Gallium Nitride (GaN) die,
wherein the normally-off power transistor is a Gate Injection Transistor (GIT), wherein the normally-on pulldown transistor is a High-Electron Mobility Transistor (HEMT),
wherein the modulation transistor is a HEMT, and
wherein the integrated driver comprises at least one GIT and/or HEMT.

17. The power switch device with integrated driver of claim 15, wherein the integrated driver circuit comprises a GIT that is configured to short the pulldown gate to the supply reference terminal.

18. The power switch device with integrated driver of claim 15, further comprising:
a first resistor terminal connected to a gate of the modulation transistor and configured for connection to an external modulation resistor having a modulation resistance, wherein the predetermined charging interval is based upon the modulation resistance; and
a second resistor terminal connected to the pulldown source and configured for connection to a steady-state resistor having a steady-state resistance, wherein the level of the maintenance current is based upon the steady-state resistance.

19. A power switch device, comprising:
a normally-off power transistor comprising a gate, a source, and a drain;
a control terminal electrically connected to the gate;
a control reference terminal;
a normally-on pulldown transistor configured to short the gate to the source when no voltage is applied across the control terminal and the control reference terminal, and comprising a pulldown gate, a pulldown source, and a pulldown drain; and
a resistance-modulation circuit comprising a modulation transistor and coupled between the source and the control reference terminal, and configured to:
modulate a resistance between the control terminal and the control reference terminal, such that a charging current is provided to the gate, for a predetermined charging interval, responsive to application of a device turn-on voltage between the control terminal and the control reference terminal, and a maintenance current is provided to the gate after the predetermined charging interval, wherein the maintenance current has a positive level that is lower than a level of the charging current,
wherein the normally-off power transistor is a Gate Injection Transistor (GIT),
wherein the normally-on pulldown transistor is a High Electron Mobility Transistor (HEMT),
wherein the modulation transistor is a HEMT, and
wherein the normally-off power transistor, the normally-on pulldown transistor, and the modulation transistor are monolithically integrated in a same die.

20. The power switch device of claim 19, wherein the same die is a Gallium Nitride (GaN) die.

21. The power switch device of claim 19, further comprising:
a bypass resistor connected in parallel with the modulation transistor; and
a voltage clamp diode connected serially to the modulation transistor such that the serially-connected voltage clamp diode and modulation transistor are coupled between the pulldown source and the pulldown gate,
wherein the bypass resistor and the voltage clamp diode are monolithically integrated in the same die as the normally-off power transistor, the normally-on pulldown transistor, and the modulation transistor.

22. The power switch device of claim 21, further comprising:
a steady-state resistor coupled between the pulldown gate and the pulldown source; and
a modulation resistor coupled between the pulldown gate and a gate of the modulation transistor,
wherein the steady-state resistor and the modulation resistor are monolithically integrated in the same die as the normally-off power transistor, the normally-on pulldown transistor, and the modulation transistor.

23. The power switch device of claim 22,
wherein the same die is a Gallium Nitride (GaN) die,
wherein each of the bypass resistor, the steady-state resistor and the modulation resistor is comprised within the GaN die,
wherein the voltage clamp diode includes one or more GaN-based resistors, one or more GaN-based capacitors, and one or more GaN-based diodes, the one or more GaN-based diodes comprising at least one of:
a gated diode, in which a source and a gate of a normally-off GaN HEMT are coupled with one or more PN diodes to form an anode, and a drain of said GaN HEMT forms a cathode, and
PN diode, in which a source and a drain of a normally-off GaN HEMT are coupled together to form an cathode, and a gate of said GaN HEMT forms an anode.

* * * * *

UNITED STATES PATENT AND TRADEMARK OFFICE
CERTIFICATE OF CORRECTION

PATENT NO. : 10,979,032 B1
APPLICATION NO. : 16/736896
DATED : April 13, 2021
INVENTOR(S) : K. Leong et al.

Page 1 of 1

It is certified that error appears in the above-identified patent and that said Letters Patent is hereby corrected as shown below:

In the Claims

Column 19, Line 45, please change "form an" to -- form a --.

Column 22, Line 44, please change "form an" to -- form a --.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*